United States Patent [19]

Takeshima

[11] Patent Number: 5,970,012
[45] Date of Patent: Oct. 19, 1999

[54] NON-VOLATILE SEMICONDUCTOR MEMORY DEVICE HAVING A MEMORY CELL CAPABLE OF ESTABLISHING MULTI-LEVEL INFORMATION AND DATA WRITING METHOD THEREOF

[75] Inventor: Toshio Takeshima, Tokyo, Japan

[73] Assignee: NEC Corporation, Tokyo, Japan

[21] Appl. No.: 08/941,201

[22] Filed: Sep. 30, 1997

[30] Foreign Application Priority Data

Sep. 30, 1996 [JP] Japan .................................. 8-258669

[51] Int. Cl.$^6$ ........................................................ G11C 8/00

[52] U.S. Cl. .................. 365/230.01; 365/185.03; 365/185.118

[58] Field of Search .................... 365/230.01, 185.28, 365/185.01, 185.14, 189.04, 185.18, 185.03

[56] References Cited

U.S. PATENT DOCUMENTS

| | | | |
|---|---|---|---|
| 5,262,984 | 11/1993 | Noguchi et al. | 365/185 |
| 5,511,021 | 4/1996 | Bergemont et al. | 365/185.03 |
| 5,550,772 | 8/1996 | Gill | 365/185.03 |
| 5,638,323 | 6/1997 | Itano | 365/185.22 |
| 5,642,312 | 6/1997 | Harai | 365/185.33 |
| 5,708,600 | 1/1998 | Hakozaki et al. | 365/185.03 |
| 5,721,701 | 2/1998 | Ikebe et al. | 365/185.03 |

*Primary Examiner*—David Nelms
*Assistant Examiner*—Tuan T. Nguyen
*Attorney, Agent, or Firm*—Sughrue, Mion, Zinn, Macpeak & Seas, PLLC

[57] ABSTRACT

The non-volatile semiconductor memory of the present invention comprises a memory cell transistor to which three or more threshold values are set by controlling the floating gate-source voltage, wherein the voltage of the floating gate is maintained constant while the voltage applied to the source is varied.

15 Claims, 10 Drawing Sheets

Fig. 1A
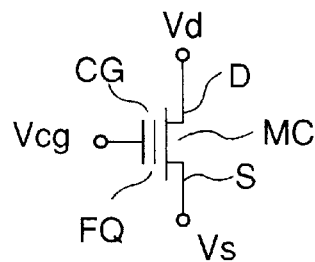
Fig. 1B
| | WRITE | | | | READ | ERASE |
|---|---|---|---|---|---|---|
| | "0" | "1" | "2" | "3" | | |
| Vcg | 12V | 12V | 12V | 12V | 5V | 0V |
| Vd | 7 | 7 | 7 | 7 | 1 | FLOW |
| Vs | 7 | 2 | 1 | 0 | 0 | 12 |
Fig. 2
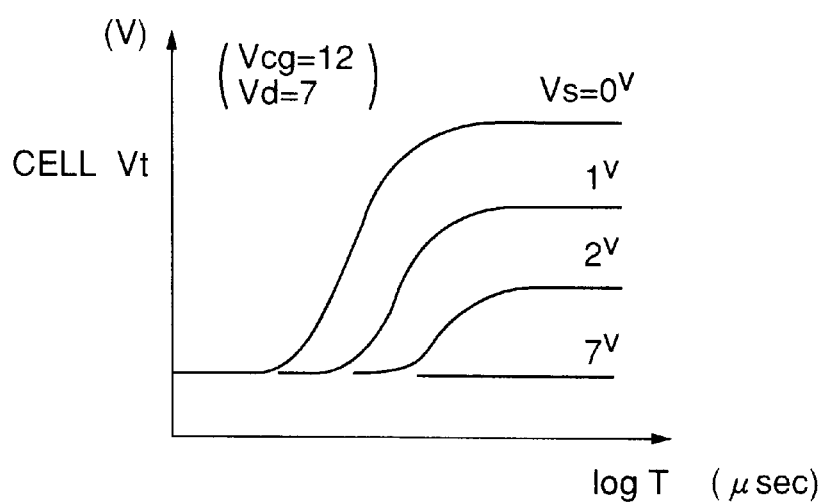

EXEMPLAY GATE CURRENT CHARACTERISTICS
OF MEMORY CELL

EXEMPLARY WRITING CHARACTERISTICS OF MEMORY CELL WITH CONTROL GATE VOLTAGE VARIATION

EXEMPLARY WRITING CHARACTERISTICS OF MEMORY CELL WITH DARIN VOLTAGE VARIATION

NON-VOLATILE SEMICONDUCTOR MEMORY DEVICE HAVING A MEMORY CELL CAPABLE OF ESTABLISHING MULTI-LEVEL INFORMATION AND DATA WRITING METHOD THEREOF

BACKGROUND OF THE INVENTION

1. Field of the Invention

This invention relates to a semiconductor memory device and data writing method thereof, and more particularly relates to a non-volatile semiconductor memory device capable of establishing multi-level information and a voltage control method for writing such information.

2. Description of the Related Art

A non-volatile semiconductor memory device has a plurality of memory cell. The memory cell has an electrode called as floating gate which is insulated electrically from a gate electrode called as control gate thereof and a silicon substrate.

Data are written in a memory cell transistor by two ways. One is a writing method (referred to as FN wiring method hereinafter) in which the control gate is maintained at a high voltage, and electrons are pulled out from the floating gate by way of tunnel current to lower the threshold voltage (referred to as cell Vt hereinafter) of the memory cell. The other one is a writing method (referred to as CHE writing method hereinafter) in which channel hot electrons are generated by a current flowing between the drain and the source by the condition that the control gate is maintained at a high voltage and the drain is maintained at a medium voltage are transferred to the floating gate to raise the cell Vt.

CHE writing method is advantageous in comparison with FN writing method in that a short time is sufficient for writing. Therefore CHE writing method has attracted attentions recently.

Recently, the demand for large memory capacity of memory IC has grown more and more. To satisfy the demand, use of multi-level information of three or higher level to be stored in memory cells has been developed.

Japanese Patent Laid-open No. Hei 7-29382 proposes a means for writing such multi-level information of three or higher level in a memory cell by way of CHE writing method.

However, the writing method involves transitional cell Vt instead of final or saturate cell Vt as multi-level information to be stored in the memory cell. Therefore, dispersion in writing characteristics of the memory cell should be concerned. The width of cell Vt distribution is wide and writing operation margin is small.

SUMMARY OF THE INVENTION

It is an object of the present invention to provide a non-volatile semiconductor memory device involving a narrow cell Vt distribution width and capable of high speed writing in writing operation of multi-level information in the memory cell.

It is another object of the present invention to provide a writing method involving narrow cell Vt distribution width and capable of high speed writing.

A semiconductor memory device of the present invention comprises a memory cell transistor having a drain, a source, a control gate, and a floating gate, wherein the source is supplied with a voltage corresponding to write information.

A writing method of the present invention in a semiconductor memory device having a memory cell transistor to which three or more threshold values are set by controlling a voltage between a floating gate and a source thereof, wherein the source of the memory cell transistor is supplied with a voltage corresponding to writing information.

According to such a semiconductor memory device and a method thereof, in writing of a multi-level information in a memory cell, the control gate voltage is maintained constant and the source voltage is varied depending on the multi-level information to be written, and thereby the effective voltage between the control gate and source can be controlled. As the result, the multi-level information is written in all the memory cells connected to a single word line in a single writing time. The saturation of the cell Vt is applied as the multi-level information to be stored in the memory cells because the effective voltage between the control gate and source can be varied. Thus the cell Vt can be set to a desired distribution width regardless of writing characteristic dispersion of the memory cells.

BRIEF DESCRIPTION OF THE DRAWINGS

The above and other objects, advantages and features of the present invention will be more apparent from the following description taken in conjunction with the accompanying draws, in which:

FIG. 1A and FIG. 1B are a set of drawings for describing a non-volatile semiconductor memory of the first embodiment of the present invention, FIG. 1A is a drawing for describing a memory cell and FIG. 1B is a drawing for describing a reading/writing method from/in the memory.

FIG. 2 is a drawing for describing writing characteristics in a memory cell by way of voltage variation of a memory cell of a non-volatile semiconductor memory in accordance with the first embodiment of the present invention.

DETAILED DESCRIPTION OF THE PREFERRED EMBODIMENTS

Figure 3:
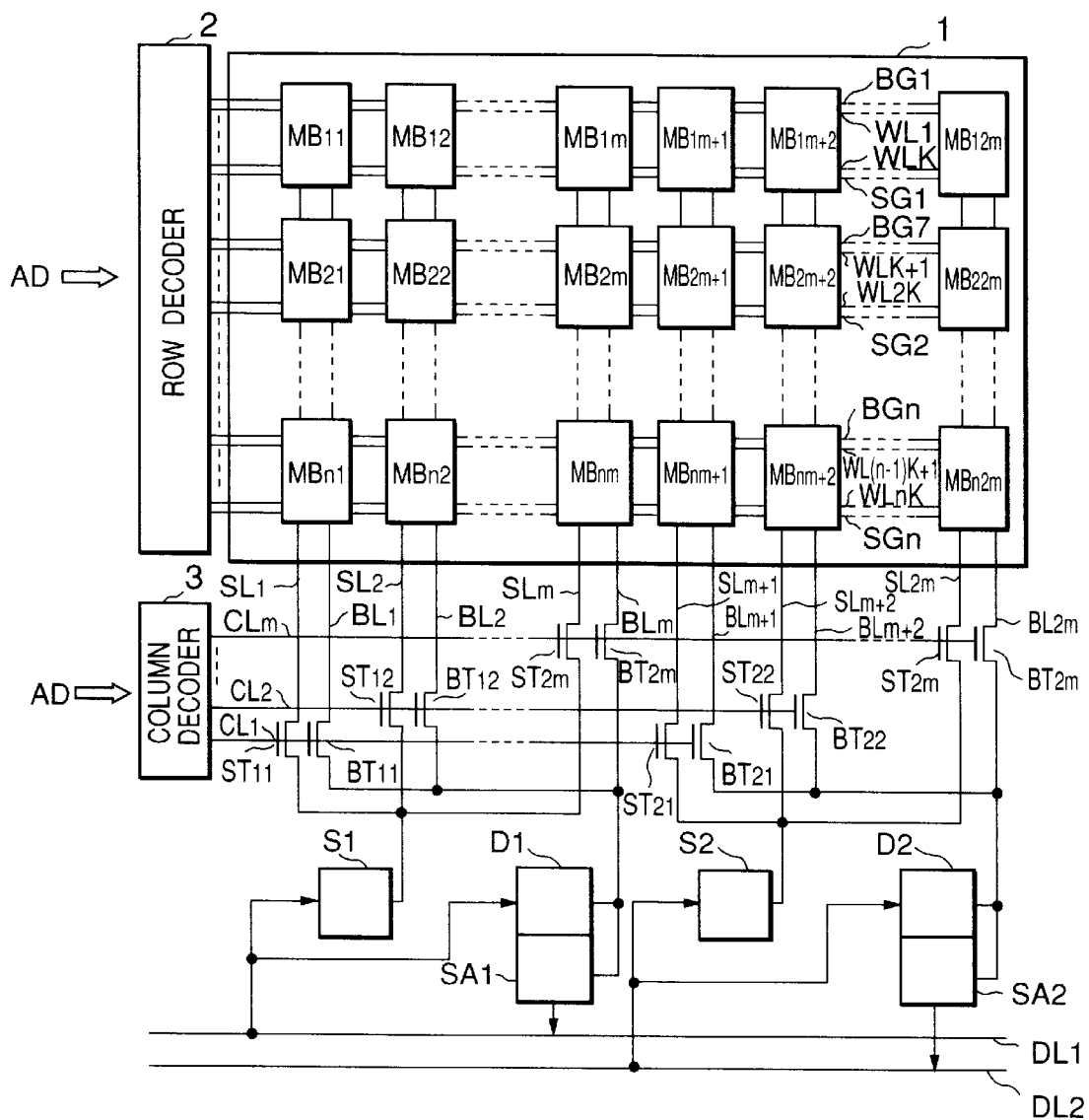
FIG. 3 is a drawing for illustrating a memory array of a non-volatile semiconductor memory in accordance with the first embodiment of the present invention.

Before embodiments of the present invention are described, the related arts will be described in detail referring to the drawing.

Figure 11A:
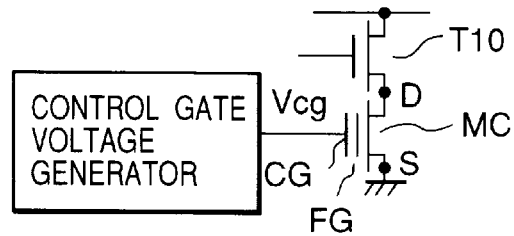
FIG. 11A and FIG. 11B are a set of drawings for illustrating an example of a conventional multi-level information writing circuit.
Figure 11B:
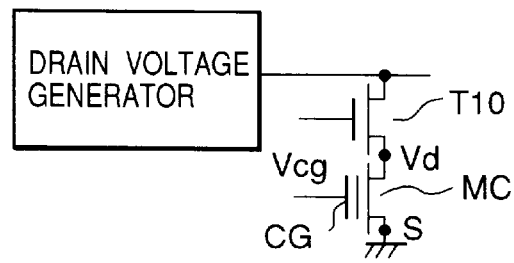

FIGS. 11A–11B are semiconductor circuits shown in Japanese Patent laid-open No. Hei 7-29382. FIG. 11A is a conventional circuit diagram to which the method involving control gate voltage variation is applied. FIG. 11B is a conventional circuit diagram to which the method involving drain voltage variation is applied. Referring to the FIG. 11A, a memory cell MC has a source electrode S coupled to a ground source line, a drain electrode D, a control gate electrode CG, and a floating gate FG. The control gate electrode CG is coupled to a control gate voltage generator. A transfer transistor T10 is connected between the drain of the memory cell MC and a signal line. Referring to the FIG. 11B, a memory cell MC has a source electrode S coupled to a ground source line, a drain electrode Vd, a control gate electrode CG, and a floating gate FG. A transfer transistor T10 is connected between the drain of the memory cell MC and a signal line. The signal line is coupled to a drain voltage generator.

The inventors of the present invention examined the circuits shown in FIGS. 11A and 11B and found that these circuits had problems described herein under.

Figure 12:
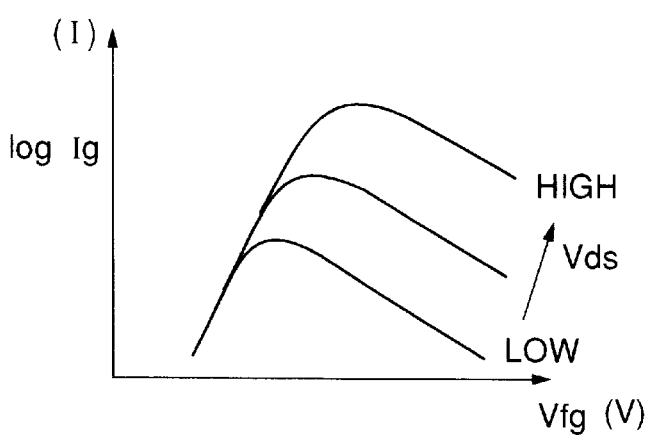
FIG. 12 is a schematic diagram for describing the dependency of the floating gate current of a memory cell transistor on the floating gate voltage and drain voltage.

FIG. 12 shows schematically dependency of the floating gate current Ig based on the variation of the floating gate voltage Vfg. The current Ig flows to the floating gate FG when the source of a memory cell is varied to the GND voltage. The Fig further shows the dependency of the drain voltage Vds of the memory cell. It is obvious that the dependency of the floating gate current Ig on the drain voltage Vds is not significant for the low floating gate voltage Vfg and the dependency of the floating gate current Ig on the drain voltage Vds is significant for the high floating gate voltage Vfg. It has been known that the floating gate current Ig has the maximum at the drain voltage Vds approximately equal to the floating gate voltage Vfg. The total capacity of the floating gate FG is represented by CT, and the capacity of the control gate is represented by CC, then, the floating gate voltage Vfg is given by (CC/CT)× Vcg. CC/CT value of a memory cell ranges usually from 0.5 to 0.7.

Figure 13A:
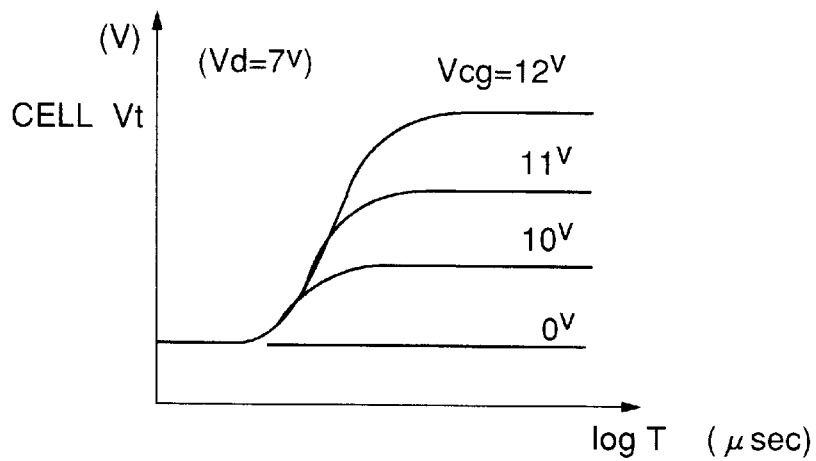
FIG. 13A and FIG. 13B are a set of drawings for describing an exemplary writing characteristics of a conventional non-volatile semiconductor memory.

FIG. 13A shows the dependency of the cell Vt of a memory cell MC on the control gate voltage Vcg. The abscissa represents the time, and the ordinate represents the cell Vt of a memory cell MC. It is obvious from this figure that the cell Vt remains at a low level during initial writing followed by rising with time, and finally approaches asymptotically to a value dependent on the control gate voltage Vcg when the control gate voltage Vcg is varied (for example 10, 11, and 12 V) while the drain voltage Vd is maintained at constant value (for example 7 V). It becomes possible that a plurality of cell Vt corresponding to multi-level information is written in the memory cell by coordinating to the multi-level information where the control voltage Vcg level is to be written.

Figure 13B:
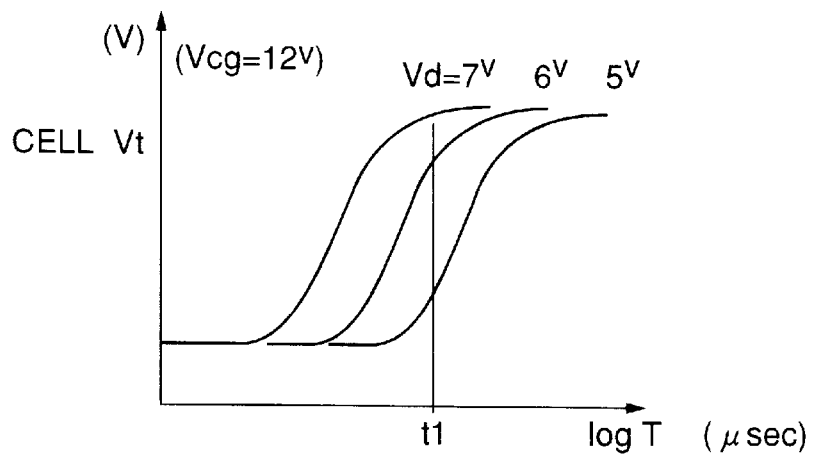

FIG. 13B shows the dependency of the cell Vt of the memory cell transistor MC shown in FIG. 11B on the drain voltage Vd. It is obvious from this figure that the cell Vt remains at a low level during initial writing followed by rising with time when the drain voltage Vd is varied (for example, 7, 6, 5V) while the control gate voltage Vd is maintained at a constant value (for example, 12 V). In the writing characteristics of cell Vt, the rising of the cell Vt is delayed (shifting to the right direction in the figure) with decreasing in the drain voltage Vd, but the final value is the same. This behavior is interpretable based on FIG. 12, that is, the floating gate current Ig decreases with decreasing in the drain voltage Vds in spite of the same floating gate voltage Vfg, and as the result, the variation in the cell Vt is delayed. Because the final value of the cell Vt is determined by the control gate voltage Vcg, the final value of the cell Vt is the same regardless of magnitude of the drain voltage Vd. Therefore it is possible to write various cell Vt in the memory cell MC as multi-level information by varying the drain voltage Vd maintaining the writing time at constant (t1).

However, in the non-volatile semiconductor memory to which the writing method described in FIG. 13A is applied, writing control of the cell Vt corresponding to multi-level information is performed by varying the control gate voltage Vcg. Therefore, only one level in a multi-level data can be written (stored) in the memory cell connected to the same word line per one writing. Therefore, if the information to be written in a certain first memory cell and second memory cell is the same, the information is written in both memory cells in one writing, but if the information to be written in the first memory cell and second memory cell is different, the memory is written separately in two writing operations in memory cells respectively. The two writing operation requires a long program time (for the case of four level information, the time for binary information is tripled), the long program time is disadvantageous.

On the other hand, in the non-volatile semiconductor memory to which the writing method shown in FIG. 13B is applied, the writing control of the cell Vt corresponding to multi-level information is performed by varying the drain voltage Vd, it is possible to write the multi-level information to be written in the first memory cell and second memory cell respectively in one writing operation in the memory cells. This writing method is more excellent in comparison with the writing method shown in FIG. 13A because of high seed writing.

However, the writing method shown in FIG. 13B involves transitional cell Vt instead of final cell Vt as multi-level information to be stored in the memory cell, therefore dispersion in writing characteristics of the memory cell should be concerned. The width of cell Vt distribution is wide and writing operation margin is small, and these disadvantages are a problem.

Turning to FIGS. 1 to 10, embodiments of the present invention will be described in detail.

FIG. 1A and FIG. 1B shows a first embodiment of a non-volatile semiconductor memory of the present invention. FIG. 2 shows an exemplary multi-level information writing characteristics in a non-volatile semiconductor memory. The cell Vt takes the erased level (logic "0"), logic "1", "2", or "3", wherein the logic "0" is the minimum value, and the logic value increases in the order from "0" to "3". Herein the number of logic levels of the memory cell is four for description.

FIG. 1A shows the structure of a memory cell MC. The memory cell has a floating gate FG, a control gate CG supplied with a control gate voltage Vcg, a drain D supplied with a drain voltage Vd, and a source S. The source is supplied with a source voltage Vs corresponding to a four-level information to be written. Herein the embodiment is featured in that the control gate voltage Vcg and drain voltage Vd are maintained at a constant value and the source voltage Vs is controlled corresponding to the write information. In detail, when the source voltage Vs is increased while the control gate voltage Vcg and drain voltage Vd is maintained at a constant value, the effective voltage Vcs between the control gate and source and the voltage Vds between the drain and source, which contribute to data writing operation in the memory cell MC, decreases. Data writing characteristics in the memory cell is estimated using the gate current characteristics shown in FIG. 12 to obtain a characteristics shown in FIG. 2. FIG. 2 shows the writing characteristics in the memory cell with varying the source voltage. The abscissa represents the time axis and the ordinate represents the cell Vt with variation of the source voltage Vs. As obvious from the drawing, the cell Vt has the minimum at the source voltage of 7 V, and the cell Vt increases with variation in the source voltage Vs from 2 V, to 1 V, and 0 V. The writing time is delayed with increasing in the source voltage Vs from 0 V, to 1 V, 2 V, and 7 V. This characteristics is attributed to the fact that the voltage Vcs between the control gate and source decreases with increasing in the source voltage Vs, and the saturation voltage of cell Vt decreases thereby. Also the drain-source voltage Vds decreases, the gate current Ig thereby decreases, and the data writing start time is delayed.

It is possible to write multi-level information in a single memory cell MC utilizing the above-mentioned characteristics. For example as shown in FIG. 1B, in the case that a logic "3" is written in the memory cell MC, the source voltage Vs is set at 0 V, the source voltage Vs is set at 1 V for a logic "2", and the source voltage Vs is set at 2 V for a logic "1". The source voltage Vs is set at 7 V to maintain the erasing state for a logic "0".

FIG. 3 is a block diagram of a memory array having the non-volatile semiconductor memory of the embodiment. To a row decoder 2, bit line selection lines BG1 to n, source line selection lines SG1 to n, and word lines WL1 to nk are connected, and the respective lines are connected to the memory array 1 (n and m are natural number). The memory array 1 is divided into a plurality of memory blocks MB11, 12, to n2m. That is, the memory array 1 comprises memory blocks of n-rows and 2m-columns. To the first row memory blocks MB 11, 12, . . . , 12m, a bit line selection line BG1, word lines WL1 to k, and a source line selection line SG1 are connected commonly. To each of the second row and the third row memory blocks and following other memory blocks, similarly the corresponding bit line selection line, word lines, and source selection line are connected respectively. To the first column memory block MB 11, 21, . . ., n1, the source line SL1 and bit line BL1 are connected commonly. To each of the second column memory block and following column memory blocks, similarly a source line and bit line are provided commonly. The source line SL1 and bit line BL1 are connected to a transistor ST11 and BT11 respectively. To each of the following column source lines SL2 to 2m and following column bit lines BL2 to 2m, similarly corresponding transistors ST12 to 2m and BT12 to 2m are connected respectively. Gates of transistors ST11, 21, BT11, and 21 are connected respectively to a column selection line CL1 led from the column decoder 3. Other transistors ST12 to 2m and BT12 to 2m are connected similarly as shown in the drawing. Source lines SL1, SL2, . . . , SLm are connected commonly to a source voltage generator S1. Source lines SLm+1, m+2 . . . , 2m are connected commonly to a source voltage generator S2. On the other hand, bit lines BL1, BL2, . . . , BLm are connected commonly to a drain voltage generator D2 and a sense amplifier SA2. The sense amplifiers SA1 and 2 amplify latched data respectively and transmit them to data lines DL1 and DL2. Writing data information is inputted to the source voltage generator S1 and 2 and drain voltage generator D1 and 2 through the data lines DL1 and DL2 respectively. Address information AD is inputted respectively to the row decoder 2 and column decoder 3. A source voltage of, for example, 3.3 V is applied to the semiconductor chip provided with the non-volatile semiconductor memory from the external.

Figure 4:
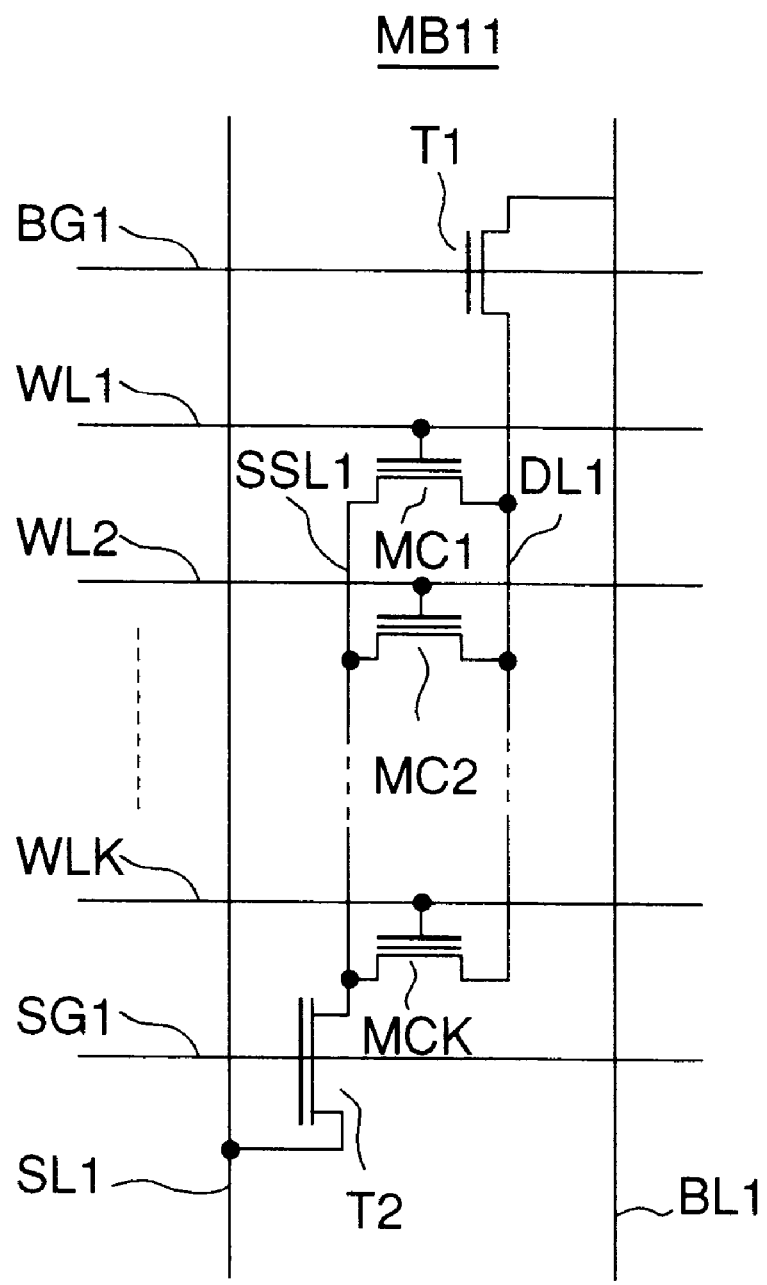
FIG. 4 is a drawing for illustrating partially the memory array of a non-volatile semiconductor memory in accordance with the present invention.

FIG. 4 shows the structure of a memory block MB11 shown in FIG. 3. The one ends (drain) and the other ends (source) of memory cells MC1, MC2, . . . , MCk are connected commonly to a drain line DL1 and sub-source line SSL1 respectively. The drain line DL1 is connected to the bit line BL1 through the selection transistor T1. The sub-source line SSL1 is connected to the source line SL1 through the selection transistor 2. Control gates of the selection transistors T1 and T2 are connected respectively to the bit line selection line BG1 and source line selection line SG1. Each control gate of the respective memory cells MC1, MC2, . . . , MCk is connected respectively to the corresponding word lines WL1, 2, . . . , k.

In the above-mentioned structure, the memory block MB11 selected with reference to a drain line selection signal and source line selection signal transmitted respectively through the drain line selection line BG1 and source line selection line SG1 transmits voltages generated by the drain voltage generator D1 and by the source voltage generator S1 to the source and drain of the memory cell MC1, 2, . . . , MCk.

Figure 5A:
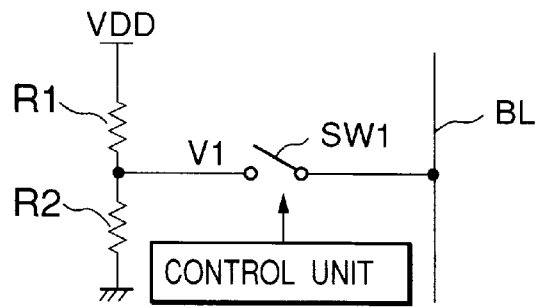
FIG. 5A is a drawing for illustrating a drain voltage applying means of the first embodiment of the present invention.
Figure 5B:
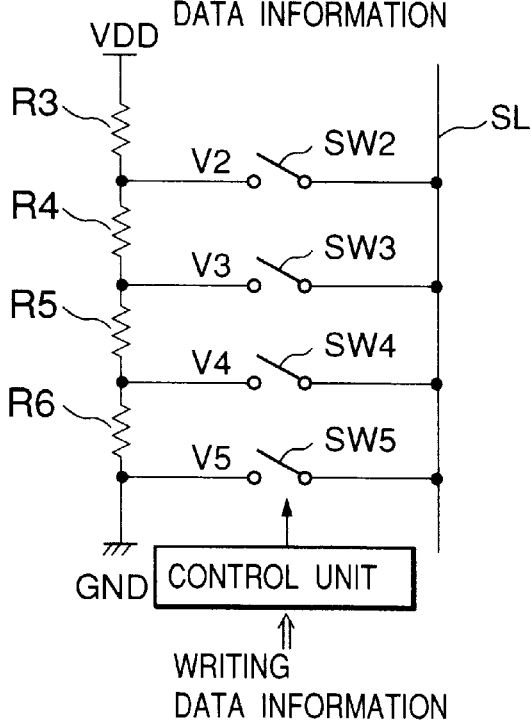
FIG. 5B is a drawing for illustrating a source voltage applying means of the first embodiment of the present invention.

FIG. 5A and FIG. 5B are schematic diagram for illustrating the circuit structure of the drain voltage generator D1 or D2, and source voltage generator S1 or S2. As shown in FIG. 5A, the circuit comprises resistors R1 and R2 disposed between in series the voltage line supplied with a power voltage Vdd generated by an internal voltage generation circuit (not shown in the drawing) and the ground voltage line supplied with a ground voltage GND, and a switch SW1 which controls ON-OFF conduction between the junction between the resisters R1 and R2 and the bit line BL depending on a writing information. A control unit receives writing data information and controls the switch SW1 in response to the writing data information. As shown in FIG. 5B, the source voltage generator S1 (S2) comprise resistors R3, R4, R5, and R6 disposed in series between the voltage line and ground voltage line, and switches SW2 to SW5 for controlling ON-OFF conduction between junctions each of which is formed between adjacent two resistors and the source line SL depending on a writing information. A control unit receives writing data information and controls the switches SW2–5 in response to the writing data information.

Operation of the drain voltage generator is described. V1 of R2/(R1+R2)×Vdd is generated. When, the resistance value of R1 and R2 is adjusted so that V1 becomes adjusted to, for example, 7 V. Similarly for the source voltage generator S1 and S2, V2 is given by (R4+R5+R6)/(R3+R4+R5+R6)×Vdd, V3 is given by (R5+R6)/(R3+R4+R5+R6)×Vdd, and V4 is given by R6/(R3+R4+R5+R6)×Vdd. Herein, the respective resistance values are adjusted so that, for example, V2 becomes adjusted to 7 V, V3 becomes adjusted to 2 V, and V4 becomes adjusted to 1 V. V5 is 0 V.

A drain voltage Vd and source voltage Vs generated as described herein above which are corresponding to a writing data information are transmitted to the bit line BL and source line SL respectively by selecting a switch with reference to the writing data information.

Figure 6:
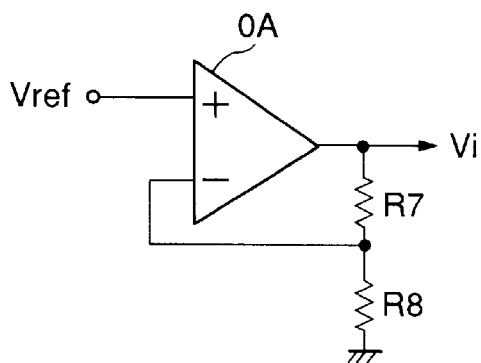
FIG. 6 is a drawing for illustrating another drain voltage and source voltage applying means of the first embodiment of the present invention.

The respective voltage generator can be differential amplifiers as shown in FIG. 6. A differential amplifier type voltage generator comprises an operational amplifier OA, resistor R7, and resistor R8. This structure generates an output voltage Vi given by the equation Vref×(1+R7/R8).

Figure 7A:
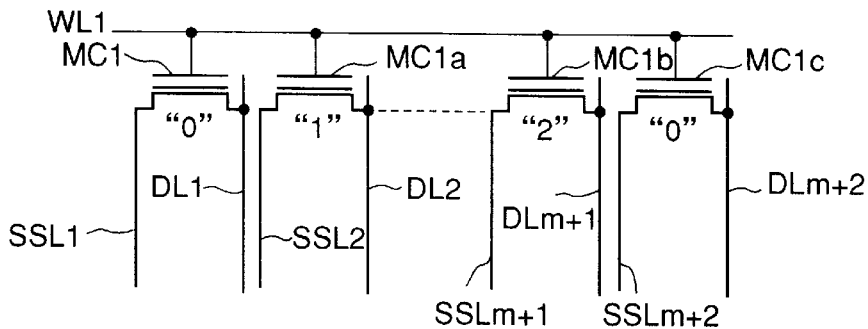
FIG. 7A and FIG. 7B are a set of waveform diagram for illustrating writing operation in a non-volatile semiconductor memory of the first embodiment of the present invention.
Figure 7B:
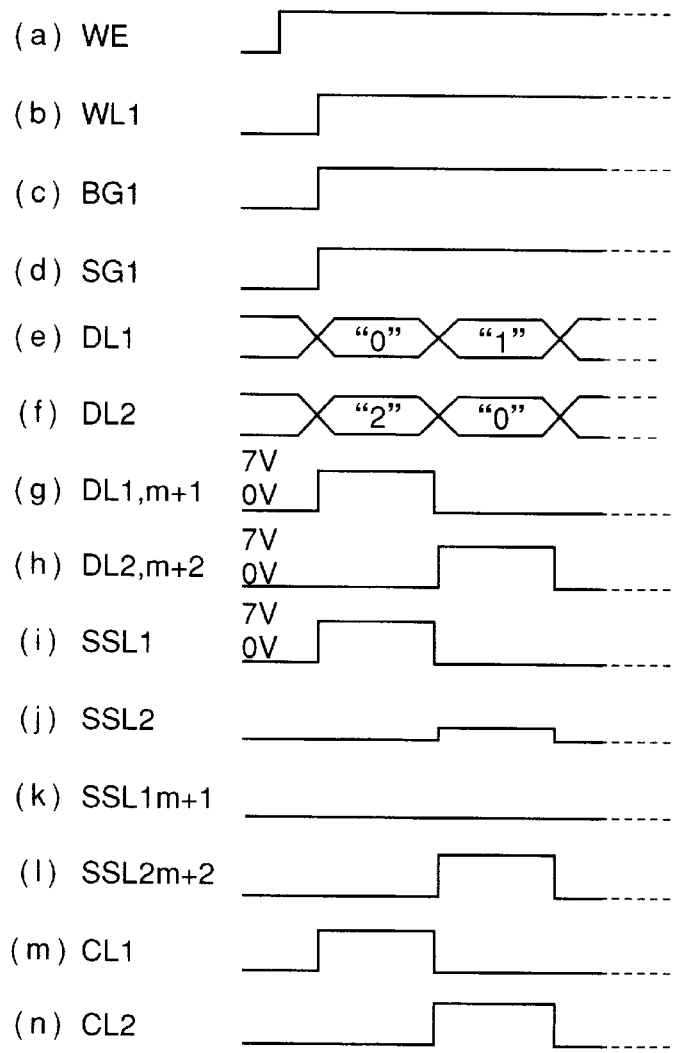

FIG. 7A and FIG. 7B are drawings for describing writing operation in a non-volatile semiconductor memory in accordance with the first embodiment. Herein, writing data "0", "1", "2", and "0" are written in the respective memory cells MC1, MC1a, MC1b, and MC1c commonly connected to the word line WL1 in memory blocks MB11, 12, 1m+1, and 1m+2 for description.

A write enable signal WE to be inputted to a semiconductor chip provided with a non-volatile semiconductor memory is activated. When, required writing data are all latched on the place (not shown) in the semiconductor chip. Next, the row decoder 2 operates the word line WL1, bit line selection line BG1, and source line selection line SG1 at high level based on an address AD. When, a writing data information which means the logic "0" is inputted to the source voltage generator S1 and drain voltage generator D1 from the data line DL1. Upon receiving the information, the source voltage generator S1 and drain voltage generator D1 operate the source line at 7 V and the bit line at 7 V respectively. Further when, a writing data information which means the logic "2" is inputted to the source voltage generator S2 and the drain voltage generator D2 from the data line DL2. Upon receiving the information, the source voltage generator S2 and the drain voltage generator D2 operate the source line at 1 V and the bit line at 7 V. Also the column decoder 3 operates the column selection line CL1 at high level, and the transistor ST11, ST 21, and BT11 and BT21 are thereby activated. By operating as described herein above, the word line WL1 is operated at 12 V, the sub-source line SSL1 is operated at 7 V, and the drain line DL1 is operated at 7 V. On the other hand, the sub-source line SSLm+1 is operated at 1 V, and drain line DLm+1 is operated at 7 V. Thereby, the memory cell MC1 is set to the cell Vt corresponding to the logic "0", and the memory cell MC1b is set to the cell Vt corresponding to the logic "2".

Next, writing operation in the memory cells MC1a and MC1c is described. The bit line selection line BG1 and source line selection line SG1 are maintained at high level. A writing data which means the logic "1" is inputted to the source voltage generator S1 and drain voltage generator D1 through the data line DL1. Further a writing data which means the logic "0" is inputted to the source voltage generator S2 and drain voltage generator D2 through the data line DL2. Thereby, the source voltage generator S1 and drain voltage generator D1 operate the source line at 2 V and the bit line at 7 V respectively. Further the source voltage generator S2 and drain voltage generator D2 operate the source line at 7 V, and bit line at 7 V. As the result of the above-mentioned operations, the sub-source lines SSL2 and SSLm+2 are set respectively to 1 V and 0 V, both drain lines DL2 and DLm+2 are set to 7 V. Thus, the memory cell MC1a is set to a cell Vt corresponding to the logic "1" and the memory cell MC1c is set to a cell Vt corresponding to the logic "0".

As described herein above, in the non-volatile semiconductor memory of the present invention, for example, memory cells connected to the word line WL1 of the memory blocks MB11 and MB1m+1 are set simultaneously to the cell Vt corresponding to the respective writing data, selection of the column decoder is switched maintaining the word line WL1 selected, thereby for example, memory cells connected to the word line WL1 of the memory blocks MB12 and MB1m+2 are set simultaneously to the cell Vt corresponding to the respective writing data. As described hereinbefore, different input data can be inputted simultaneously to a plurality of memory cells respectively while a single word line is connected.

Next, reading operation is described. For example, when the information stored in the memory cell MC1 of the memory block MB11 is read, the column selection line CL1 is operated at high level, and the bit line selection line BL1 is set to 1 V and the source line selection line SL1 is set to 0 V as shown in FIG. 1B. The level of the bit line selection line BL1 is set not by the drain voltage generator D1, but set by the sense amplifier SA1. Therefore the output of the drain voltage generator D1 is open or floating state at the time. The word line WL1 is operated, for example, at 5 V. When, the conduction of the cell transistor is detected by way of volt variation of the bit line. For erasing operation of the same memory cell, similarly the word line WL1 is 0 V, drain line DL1 is in flow condition, and source line SL1 is 12 V.

Figure 8:
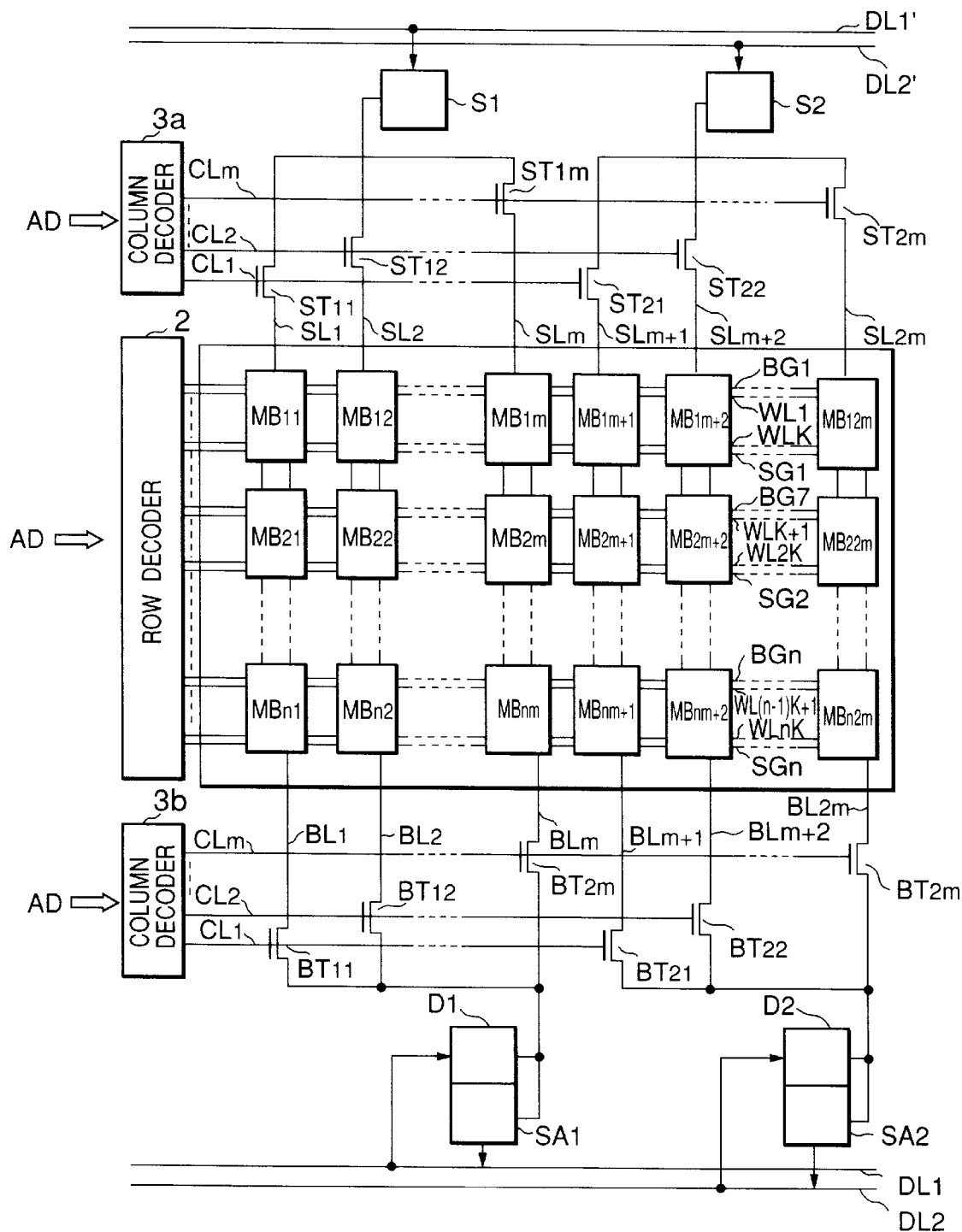
FIG. 8 is a drawing for illustrating a memory array of a non-volatile semiconductor memory in accordance with the second embodiment of the present invention.

FIG. 8 is a block diagram for illustrating the second embodiment. This embodiment is different from the block diagram shown in FIG. 3 in that the data lines DL1 and DL2, column decoder 3b, drain voltage generators D1 and D2, and sense amplifiers SA1 and 2 are disposed on the one side of the memory cell array 1, and the data lines DL1' and DL2', column decoder 3a, and source voltage generators S1 and S2 are disposed on the other side of the memory array 1. The same writing data information flows through the data lines DL1 and DL2 and data lines DL1' and DL2'. Column decoders 3a and 3b are circuits having the same structure. Such structure is featured in that wiring for connecting circuits can be arranged easily because the drain voltage generators, source voltage generators, and sense amplifier are all disposed on the both sides of the memory array 1 in FIG. 8 unlike in FIG. 3. However, FIG. 3 is featured in reduced area because it requires only one column decoder. Operation is the same as that of FIG. 3, and the description is omitted.

Figure 9:
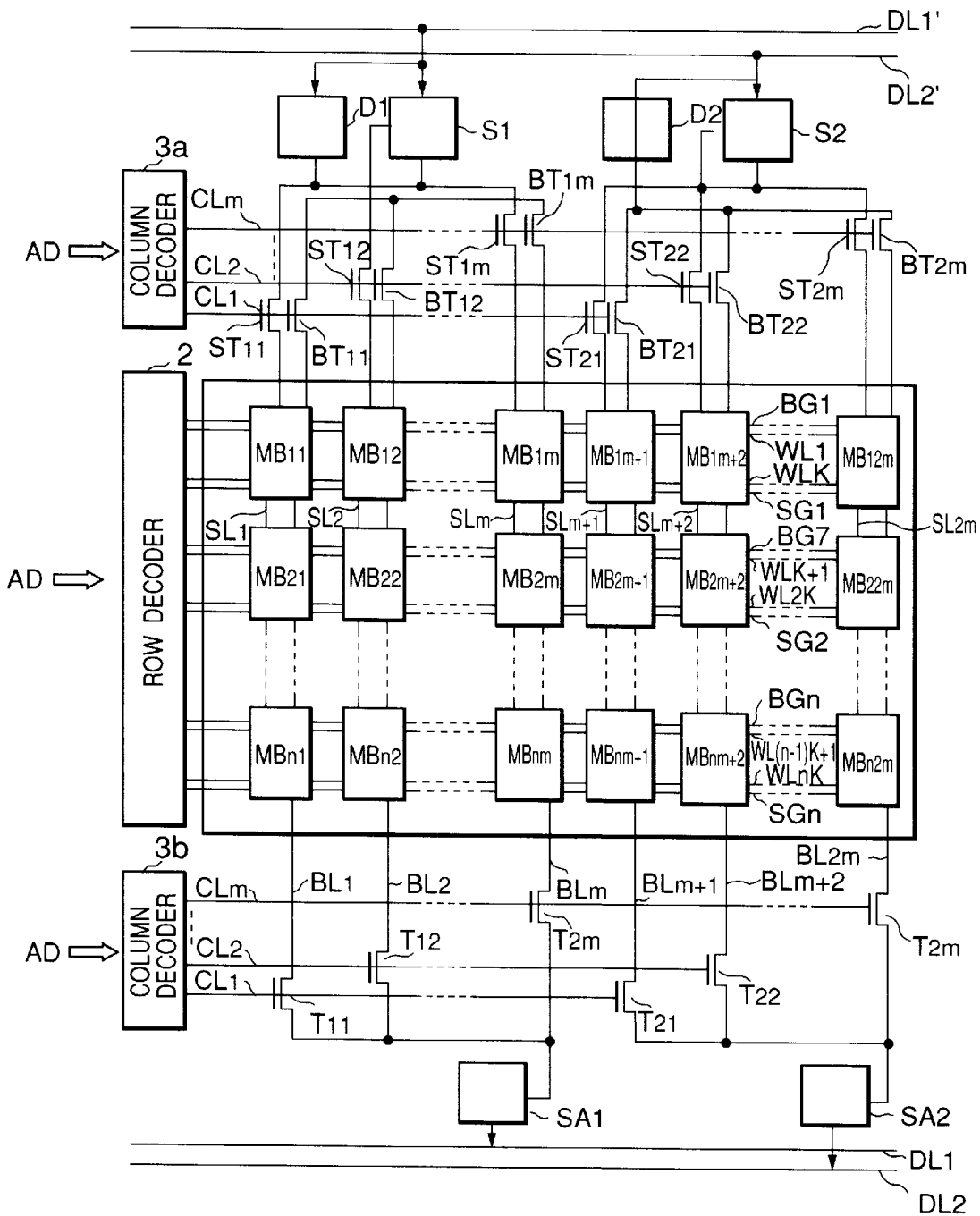
FIG. 9 is a drawing for illustrating a memory array of a non-volatile semiconductor memory in accordance with the third embodiment of the present invention.

FIG. 9 is a block diagram of a memory cell array for illustrating the third embodiment. FIG. 9 is different from the FIG. 3 in that data lines DL1 and DL2, column decoder 3b, and sense amplifiers SA1 and 2 are disposed on the one side of the memory cell and data lines DL1' and DL2', column decoder 3a, drain voltage generator D1 and D2, and source voltage applying means S1 and S2 are disposed on the other side of the memory cell array. Effect is the same as FIG. 8 and the description is omitted.

Figures 10A, 10B:
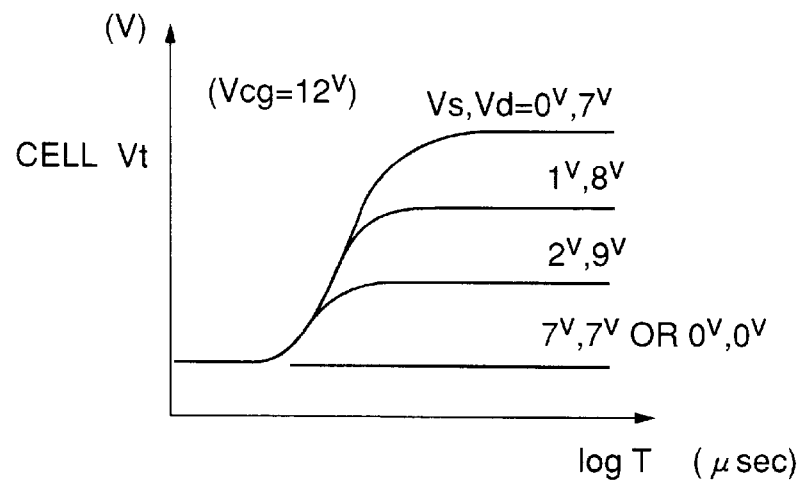
FIG. 10A and FIG. 10B are a set of drawings for describing a writing method in a non-volatile semiconductor memory of the fourth embodiment of the present invention.

FIG. 10A and FIG. 10B are drawings for describing writing method in the memory cell of the fourth embodiment. The memory cell is described using FIG. 1A.

In the previous embodiments described hereinbefore, though only the case that the drain voltage to be applied to the memory cell is fixed at a constant value (7 V) has been described, alternately this embodiment discloses a writing method in which the drain voltage is varied with the source voltage depending on data of the multi-level information. In detail, if writing data is the logic "3" and logic "0", then the drain voltage Vd is 7 V that is the same as the value described in the previous embodiments, however, the drain voltage Vd is 8 V (source voltage is 1 V) for the logic "2", and the drain voltage Vd is 9 V (source voltage is 2 V) for the logic "1". The voltage generator for generating that drain voltage generates such a voltages (not shown).

According to this method, the effective voltage Vds between the drain and source which contributes to data writing operation in the memory cell MC is maintained constant (7 V), and the gate current Ig does not decrease. FIG. 10B shows data writing characteristics in the memory cell. As shown in FIG. 10B there is no delay of data writing start time in the memory cell.

Accordingly, the writing method of the fourth embodiment is featured in faster operation in comparison with the writing method of the first embodiment. In the case of the logic "0", the source voltage Vs may be set to a value equal to the drain voltage Vs, therefore it is allowable that the source voltage Vs is 0 V and drain voltage Vd is 0 V.

The circuit structure of the non-volatile semiconductor memory applied to the writing method of the fourth embodiment is the same as the circuit shown in FIG. 3, and description is omitted.

The present invention is by no means limited to the embodiments described hereinbefore, various modifications are possible as long as the scope of the invention remains unchanged. For example, the memory cell array structure is not limited to the embodiments described hereinbefore, and can be applied to different structures. The voltage applied to the gate, source, and drain of the memory cell is not limited to the embodiments described hereinbefore. In description of the embodiments, the maximum number of logic levels of four of the memory cell of the present invention is described, however the number of logic levels are not limited to four and the number of logic levels can be three or more. The structure, in which two sense amplifiers, two source voltage generators, and two drain voltage generators are provided, and different writing data are written simultaneously in two memory cells connected to a single word line, is described in the embodiments of the present invention, however, the present invention is not limited to this structure, for example, the structure, in which three or more sense amplifiers, three or more source voltage generators, and three or more drain voltage generators are provided and different writing data are written simultaneously in three or more memory cells connected to a single word line, may be employed.

As described hereinbefore, according to the writing method in non-volatile semiconductor memory of the present invention, different multi-level information is written simultaneously and controlled by applying independently the voltage corresponding to writing data in a plurality of memory cells connected to a single word line. Further, the writing operation can be made faster by varying the voltage applied to the sources and also to the drain depending on writing data. Therefore, the present invention contributes to the faster and higher performance information processing and improvement of operational margin of memory chip reading operation.

What is claimed is:

1. A semiconductor memory device comprising:
   a memory cell transistor taking one of a plurality of threshold values to be stored in accordance with a plurality of data; and
   a control circuit which supplies a first source voltage to a source of said memory cell transistor and a first drain voltage to a drain of said memory cell transistor when a first data is stored in said memory cell transistor;
   wherein when a second data which is different from said first data is stored in said first memory cell transistor, a second source voltage which is different from said first source voltage is supplied to a source of said memory cell transistor and a second drain voltage which is different from said first drain voltage is supplied to a drain of said memory cell transistor.

2. The device as claimed in claim 1, wherein:
   the difference between said first drain voltage and said first source voltage and the difference between said second drain voltage and said second source voltage are substantially constant.

3. A semiconductor memory device, comprising:
   first and second memory cell transistors each taking one of a plurality of threshold values to be stored in accordance with a plurality of data by controlling a voltage between a control gate and a source thereof;
   a word line connected to control gates of said first and second memory cell transistors in common; and
   a control circuit which supplies a first source voltage to a source of said first memory cell transistor and a first drain voltage to a drain of said first memory cell transistor when a first data is stored in said first memory cell transistor,
   wherein when a second data which is different from said first data is stored in said first memory cell transistor, a second source voltage, which is different from said first source voltage, is supplied to a source of said second memory cell transistor, and a second drain voltage, which is different from said first drain voltage, is supplied to a drain of said second memory cell transistor.

4. The device as claimed in claim 3, wherein the difference between said first drain voltage and said first source voltage is the substantially same as the difference between said second drain voltage and said second source voltage.

5. A writing method in a semiconductor memory device having a plurality of memory cell transistors each taking one of a plurality of threshold values to be stored in accordance with a plurality of data;
   wherein a source and a drain of a first memory cell transistor of said plurality of memory cell transistors are supplied with a first source voltage and a first drain voltage, respectively, when a first data is stored in said first memory cell transistor; and
   wherein when a second data different from said first data is stored in said first memory cell transistor, said source and said drain of said first memory cell transistor are supplied with a second source voltage different from said first source voltage and a second drain voltage different from said first drain voltage, respectively.

6. The method as claimed in claim 5, further comprising a second memory cell transistor having a control gate connected to a word line which is connected to a control gate of said first memory cell transistor, wherein a third source voltage different from said first source voltage is supplied to a source of said second memory cell transistor and a third drain voltage different from said first drain voltage is supplied to a drain of said second memory cell transistor when a third data different from said first data is stored in said second memory cell transistor.

7. A semiconductor memory device comprising:
   a memory cell array;
   first and second memory cell blocks in said memory cell array, said first memory cell block having a first line, a second line, a word line, and a first memory cell transistor, said first memory cell transistor having a first control gate coupled to said word line, a first source coupled to said first line and a first drain coupled to said second line, said second memory block having a third line, a fourth line, said word line, and a second memory cell transistor, said second memory cell transistor having a second control gate coupled to said word line, a second source coupled to said third line and a second drain coupled to said fourth line;

a first voltage generator supplying said first line with a first voltage corresponding to first write information;

a second voltage generator supplying said third line with a second voltage corresponding to second write information;

a third voltage generator supplying said second line with a third voltage corresponding to said first write information;

a fourth voltage generator supplying said fourth line with a fourth voltage corresponding to said second write information; and a decoder which supplies a word line voltage to said word line at a write mode, said word line voltage being higher than said first voltage, said second voltage, said third voltage, and said fourth voltage.

8. The device as claimed in claim 7, wherein:

each of said first and second memory cell transistors takes one of a plurality of threshold values to be stored in accordance with a plurality of data, and said first and third voltage generators supply said first voltage and said third voltage, respectively, in accordance with said first write information; and said second and fourth voltage generators supply said second voltage different from said first voltage and said fourth voltage different from said third voltage, respectively, in accordance with said second write information different from said first write information.

9. The device as claimed in claim 7, wherein said first and second voltage generators are disposed on one side of said memory cell array and said third and fourth voltage generators are disposed on opposite side of said memory cell array.

10. A writing method in a semiconductor memory device having first through fourth memory cell transistors, each including control gates coupled to a word line commonly, comprising the steps of:

activating said word line;

supplying a first voltage corresponding to first write data to a first source of said first memory cell transistor from a first source voltage generator and a second voltage to a first drain of said first memory cell transistor from a first drain voltage generator during a first period;

supplying a third voltage corresponding to second write data to a second source of said second memory cell transistor from a second source voltage generator and a fourth voltage to a second drain of said second memory cell transistor from a second drain voltage generator during said first period;

supplying a fifth voltage corresponding to third write data to a third source of said third memory cell transistor from said first source voltage generator and a sixth voltage to a third drain of said third memory cell transistor from said first drain voltage generator during a second period; and supplying a seventh voltage corresponding to fourth write data to a fourth source of said fourth memory cell transistor from said second source voltage generator and an eighth voltage to a fourth drain of said fourth memory cell transistor from said second drain voltage generator during said second period;

electrically, connecting said first source with said first source voltage generator, connecting said second source with said second source voltage generator, connecting said first drain with said first drain voltage generator, and connecting said second drain with said second drain voltage generator, when a first control signal is activated, during said first period;

electrically, preventing said third source from connecting with said second source voltage generator, preventing said fourth source from connecting with said first source voltage generator, preventing said third drain from connecting with said second drain voltage generator, and preventing said fourth drain from connecting with said first drain voltage generator, when a second control signal is disactivated, during said first period;

electrically, connecting said third source with said second source voltage generator, connecting said fourth source with said first source voltage generator, connecting said third drain with said second drain voltage generator, and connecting said fourth drain with said first drain voltage generator, when said first control signal is disactivated, during said second period; and electrically, preventing said first source from connecting with said first source voltage generator, preventing said second source from connecting with said second source voltage generator, preventing said first drain from connecting with said first drain voltage generator, and preventing said second drain from connecting with said second drain voltage generator, when said second control signal is activated, during said second period.

11. The method as claimed in claim 10, wherein said second, fourth, sixth, and eighth voltages is corresponding to said first, second, third, and fourth write data, respectively.

12. The method as claimed in claim 10, wherein said second, fourth, sixth, and eighth voltages is by a predetermined value higher than said first, third, fifth, and seventh voltages, respectively.

13. A semiconductor memory device comprising:

a plurality of pairs of drain and source lines;

a plurality of block selection lines;

a plurality of groups of word lines;

a plurality of memory blocks, each of said memory blocks arranged at each crossing points of said pairs of drain and source lines and said block selection lines so that each of said memory blocks has the respective one of said pairs of drain and source lines, the respective one of said block selection lines, and each of said memory blocks having the respective one of groups of word lines;

each of said memory blocks having a plurality of memory cell transistors, each of said memory cell transistors having drain commonly electrically connected to said drain line therein when said block selection line is activated, source commonly electrically connected to said source line therein when said block selection line is activated, and gate connected to the respective word line therein;

a source voltage generator supplying a source voltage, corresponding to write data, to one of said plurality of source lines, said source voltage is lower than a word line voltage supplied to said word line at a write mode; and a drain voltage generator supplying a drain voltage to one of said plurality of drain lines, said drain voltage is lower than said word line voltage.

14. The device as claimed in claim 13, wherein each of said memory cell transistors takes one of a plurality of threshold values to be stored in accordance with a plurality of data, and said source voltage generator supplies a first source voltage and a second source voltage with a first voltage and a third voltage, respectively, in accordance with first write information, and second and fourth voltage generators supply a second voltage different from said first voltage and a fourth voltage different from said third voltage, respectively, in accordance with second write information different from said first write information.

15. The device as claimed in claim 13, further comprising a decoder for connecting said source voltage generator and said drain voltage generator with one of said source line and one of said drain line respectively in response to address signal to supply one of a plurality of write data to each of said memory blocks.

* * * * *